(12) United States Patent
Rupper et al.

(10) Patent No.: US 11,675,002 B2
(45) Date of Patent: Jun. 13, 2023

(54) TERAHERTZ PLASMONICS FOR TESTING VERY LARGE-SCALE INTEGRATED CIRCUITS UNDER BIAS

(71) Applicant: The Government of the United States, as represented by the Secretary of the Army, Washington, DC (US)

(72) Inventors: Greg Rupper, Silver Spring, MD (US); John Suarez, Brooklyn, NY (US); Sergey Rudin, Dayton, MD (US); Meredith Reed, Perry Hall, MD (US); Michael Shur, Latham, NY (US)

(73) Assignee: The Government of the United States, as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 17/121,851

(22) Filed: Dec. 15, 2020

(65) Prior Publication Data
US 2022/0011363 A1    Jan. 13, 2022

Related U.S. Application Data

(62) Division of application No. 15/437,713, filed on Feb. 21, 2017, now Pat. No. 10,890,618.

(51) Int. Cl.
*G01R 31/311* (2006.01)
*G01R 31/265* (2006.01)
*G01R 31/3185* (2006.01)
*G01R 31/28* (2006.01)

(52) U.S. Cl.
CPC ........ *G01R 31/311* (2013.01); *G01R 31/2656* (2013.01); *G01R 31/2815* (2013.01); *G01R 31/318533* (2013.01)

(58) Field of Classification Search
CPC .............. G01R 31/311; G01R 31/2656; G01R 31/2815; G01R 31/318533
See application file for complete search history.

(56) References Cited

U.S. PATENT DOCUMENTS

| 2006/0164115 A1* | 7/2006 | Komiya | G01R 31/311 |
| | | | 324/754.21 |
| 2016/0203255 A1* | 7/2016 | Suarez | G06F 30/398 |
| | | | 716/136 |

* cited by examiner

*Primary Examiner* — Paresh Patel
(74) *Attorney, Agent, or Firm* — Ronald Krosky

(57) ABSTRACT

Various embodiments are described that relate to failure determination for an integrated circuit. An integrated circuit can be tested to determine if the integrated circuit is functioning properly. The integrated circuit can be subjected to a specific radiation such that the integrated circuit produces a response. This response can be compared against an expected response to determine if the response matches the expected response. If the response does not match the expected response, then the integrated circuit fails the test. If the response matches the expected response, then the integrated circuit passes the test.

18 Claims, 14 Drawing Sheets

TERAHERTZ PLASMONICS FOR TESTING VERY LARGE-SCALE INTEGRATED CIRCUITS UNDER BIAS

CROSS-REFERENCE

This application is a divisional patent application of, and claims priority to, U.S. application Ser. No. 15/437,713 filed on Feb. 21, 2017. The entirety of U.S. application Ser. No. 15/437,713 is hereby incorporated by reference.

GOVERNMENT INTEREST

The innovation described herein may be manufactured, used, imported, sold, and licensed by or for the Government of the United States of America without the payment of any royalty thereon or therefor.

BACKGROUND

An electrical system can comprise various electrical hardware components, such as transistors. As more electrical hardware components are added to the electrical system, it can be beneficial to have the electrical system incorporated into a substrate as an integrated circuit. The integrated circuit can be used in a variety of applications, such as personal computers and communications equipment.

SUMMARY

In one embodiment, a system, comprises an emission component and a reception component. The emission component can be configured to cause an emission of a radiation set upon an integrated circuit such that the integrated circuit produces a response. The reception component can be configured to receive the response. The response, in view of the radiation set, can indicate a failure state of the integrated circuit. The emission component, the reception component, or a combination thereof can be, at least in part, non-software.

In another embodiment, a system comprises an analysis component and a determination component. The analysis component can be configured to perform an analysis on a response produced by an emission of a radiation upon an integrated circuit. The determination component can be configured to determine a health of the integrated circuit based, at least in part, on a result of the analysis. The report can be outputted that indicates the health. The analysis component, the determination component, or a combination thereof can be implemented, at least in part, by way of hardware.

In yet another embodiment, a method can comprise recognizing, by way of a failure test apparatus, a failure of an integrated circuit. The method can additionally comprise determining a radiation frequency subjected upon the integrated circuit. The method can also comprise determining a response voltage of the integrated circuit that is in response to being subjected to the radiation frequency. In addition, the method can comprise propagating an information set onto a database. The information set can reflect the radiation frequency, the response voltage, and the failure.

BRIEF DESCRIPTION OF THE DRAWINGS

Incorporated herein are drawings that constitute a part of the specification and illustrate embodiments of the detailed description. The detailed description will now be described further with reference to the accompanying drawings as follows.

DETAILED DESCRIPTION

Figure 1:
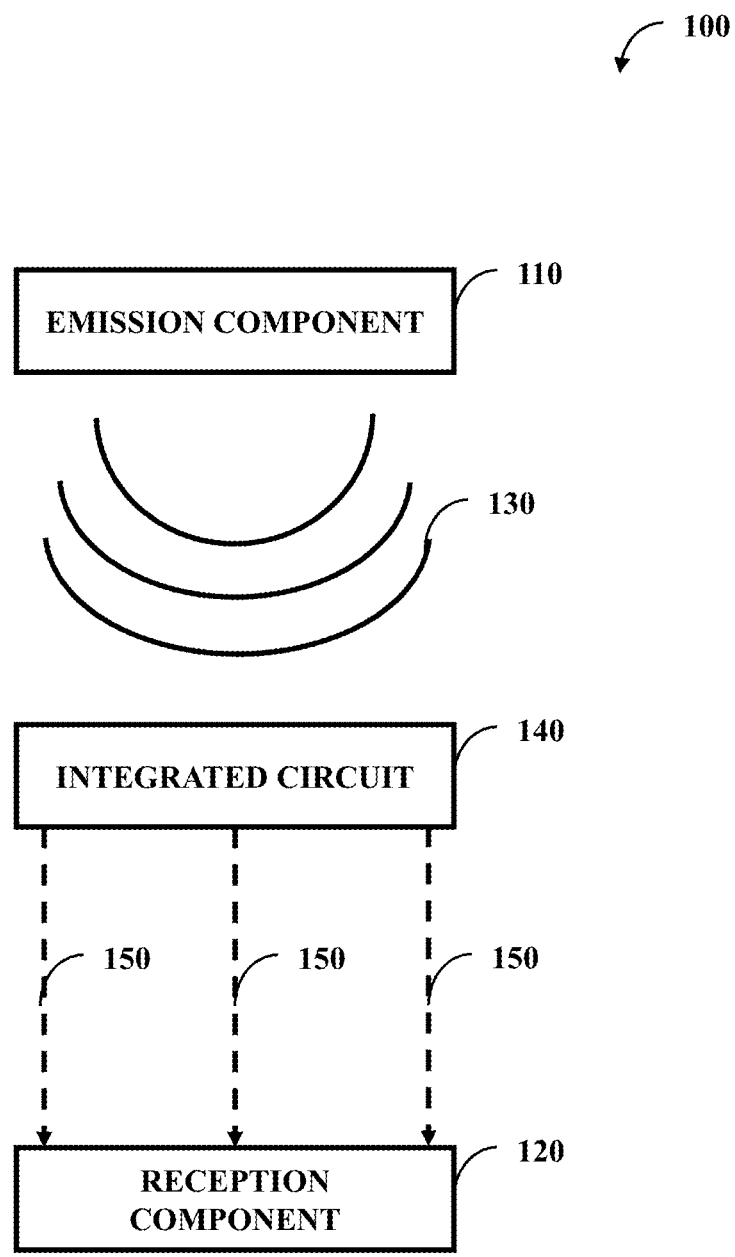
FIG. 1 illustrates one embodiment of an environment with a system comprising an emission component and a reception component.

Field effect transistors (FETs) can be used as efficient detectors of Terahertz (THz) radiation. In these detectors, non-linearities in the propagation of plasma waves in the two-dimensional electronic fluid of the FET channels produce a direct current voltage from the THz radiation. Such plasmonic detectors could operate at frequencies much higher than their cut-off frequency or maximum frequency of oscillations. FETs operating in the plasmonic regimes can be used as THz detectors, mixers, phase shifters and frequency multipliers at THz. The plasmonic FET detectors can be advantageous because they can detect single THz pulses with enhanced responsivity and can be compatible with integrated circuit technologies, including Si CMOS.

Non-linearities of the electron plasma in FET channels can be used to test integrated circuits, such as a Monolithic Microwave Integrated Circuit (MMIC). Multiple non-linearities in plasma propagation can exist, such as a non-linearity that is proportional to the derivative of the velocity of the electrons and a non-linearity is proportional to a derivative of the current (e.g., velocity times density), as such, low frequencies may not produce a detectable response in at least some circumstances. In addition, to achieve a desirable collective (plasma) oscillation, the signal can be significantly slower than the electron-electron scattering. For the electron plasmas that are typical in VLSI transistor channels, these non-linearities are can be probed with radiation in the THz range. The response of these non-linearities is dependent on the density of the electron plasma within the channel as well as the electrical boundary conditions and parasitic aspects of the transistor, making the response sensitive to many of the parameters that are important for proper transistor operation. A THz overdamped plasmonic response can be used to detect faults in Si CMOS. The polarization dependence of the terahertz response can also be used to increase the effectiveness of this technique. The advantage of this approach to testing MMICs and VLSIs is that the transistors can be tested unbiased (so there is no need to connect them to the sources) or biased and several transistors within the circuit and the entire circuit can be tested.

Increasing complexity and decreasing feature size of integrated circuits brings to the forefront the issues of non-destructive comprehensive and ubiquitous testing. THz imaging can be used for testing Very Large Scale Integration (VLSI), but the image quality is limited by the diffraction limit on the order of tens or even hundreds of microns because of a relatively long wavelength of the sub-THz and THz radiation. Using the laser terahertz emission microscopy for testing VLSI, the resolution could be improved to approximately 3 microns, which still might not be good enough for modern VLSI with feature sizes as small as 7 nm.

Field effect transistors (FETs) can be used as efficient detectors of the THz radiation using the excitation of propagating or overdamped plasma waves in the two-dimensional electronic fluid in the FET channels. Such plasmonic detectors could operate at frequencies much higher than their cut-off frequency or maximum frequency of oscillations. FETs operating in the plasmonic regimes can also be used as THz detectors, mixers, phase shifters and frequency multipliers at THz. The plasmonic FET detectors have advantages over Schottky diode detectors, such as by detecting single THz pulses with enhanced responsivity and being compatible with integrated circuit technologies, including a silicon (Si) Complementary metal-oxide semiconductor (CMOS). A THz overdamped plasmonic response can be used to detect faults in Si CMOS. Polarization dependence can be added as a part of the terahertz response and can be used to testing a MIMIC. The advantage of this approach to testing MMICs and VLSIs is that the transistors can be tested unbiased (e.g., so there is no need to connect them to the sources) or biased and several transistors within the circuit and the entire circuit can be tested.

In one embodiment, a product manufacturer can obtain pre-fabricated integrated circuits from an outside party. In one example, a medical manufacturer can obtain an integrated circuit from a chip manufacturer. The medical manufacturer can incorporate the integrated circuit into a medical device, such as a monitor, a defibrillator, or a breathing machine. The medical device can be complex and, in turn, the integrated circuit can be complex with a vast number of transistors and other electrical hardware components.

With the integrated circuit being incorporated in the medical device, failure of the integrated circuit could be catastrophic. In one example, if the integrated circuit is incorporated in the defibrillator and the integrated circuit fails, then the defibrillator could fail to function and a patient may die. Since the medical manufacturer is not manufacturing the integrated circuit, the medical manufacturer should place in a control mechanism to determine if the integrated circuit is properly functioning before integration.

The control mechanism can subject the integrated circuit to a radiation at a specific frequency. When functioning properly, the integrated circuit can have an anticipated response to the specific radiation frequency. When subjecting the integrated circuit to the specific radiation frequency an actual response can be measured. Comparing the actual response against the anticipated response can result in determining if the integrated circuit is properly functioning or failing. If the actual response matches the anticipated response, such as within a tolerance, then the integrated circuit can be considered to be properly functioning and can be used by the medical device. If the actual response does not match the anticipated response, then the integrated circuit can be considered to be failing and can be discarded.

The following includes definitions of selected terms employed herein. The definitions include various examples. The examples are not intended to be limiting.

"One embodiment", "an embodiment", "one example", "an example", and so on, indicate that the embodiment(s) or example(s) can include a particular feature, structure, characteristic, property, or element, but that not every embodiment or example necessarily includes that particular feature, structure, characteristic, property, or element. Furthermore, repeated use of the phrase "in one embodiment" may or may not refer to the same embodiment.

"Computer-readable medium", as used herein, refers to a medium that stores signals, instructions and/or data. Examples of a computer-readable medium include, but are not limited to, non-volatile media and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, other optical medium, a Random Access Memory (RAM), a Read-Only Memory (ROM), a memory chip or card, a memory stick, and other media from which a computer, a processor or other electronic device can read. In one embodiment, the computer-readable medium is a non-transitory computer-readable medium.

"Component", as used herein, includes but is not limited to hardware, firmware, software stored on a computer-readable medium or in execution on a machine, and/or combinations of each to perform a function(s) or an action(s), and/or to cause a function or action from another component, method, and/or system. Component may include a software controlled microprocessor, a discrete component, an analog circuit, a digital circuit, a programmed logic device, a memory device containing instructions, and so on. Where multiple components are described, it may be possible to incorporate the multiple components into one physical component or conversely, where a single component is described, it may be possible to distribute that single component between multiple components.

"Software", as used herein, includes but is not limited to, one or more executable instructions stored on a computer-readable medium that cause a computer, processor, or other electronic device to perform functions, actions and/or behave in a desired manner. The instructions may be embodied in various forms including routines, algorithms, modules, methods, threads, and/or programs, including separate applications or code from dynamically linked libraries.

"Frequency", when referring to the frequency of terahertz emission, the frequency can refer to part of an electromagnetic emission that contributes to a measured response (e.g., a significant amount of the measured response).

FIG. 1 illustrates one embodiment of an environment 100 with a system comprising an emission component 110 and a reception component 120. The emission component 110 can be configured to cause an emission of a radiation set 130 upon an integrated circuit 140 such that the integrated circuit produces a response 150. The reception component 120 can be configured to receive the response. The response 150, in view of the radiation set 130, can indicate a failure state of the integrated circuit 140.

The response 150 can be considered a measurement from the radiation set 130. In one example, the measurement is done under a predetermined series of bias voltages of the integrated circuit 140. In one example, the measurement is done under a predetermined series of the modulated integrated circuit bias voltages and the response 150 compared with the etalon as functions of the modulation frequencies for a comparison result. The response 150 can be used in a number of manners. In one example, the response 150 is used to determine a manufacturer of the integrated circuit 140.

The response 150 can be transmitted to a data processing unit (e.g., wirelessly transmitted to the data processing unit). The data processing unit can process the response 150 in accordance with big data processing techniques.

The emission of the radiation set 150 can be composed of a narrow band of frequencies around a center frequency, such as a narrow band produced by a THz laser, or can be a broad band of frequencies around a center frequency, such as a broad band produced by a short THz pulse. The emission of the radiation set 150 can have multiple peaks, frequency aspects that do not significantly impact the measured response, and/or aspects that introduce unwanted features to the measured response (e.g., noise).

The radiation set 130 can be a plasmon emission that comprises one or more frequencies. In one example, the emission component 110 emits a first frequency at 0.2 terahertz and a second frequency at 0.6 terahertz. The values of the first frequency and the second frequency can be above (including equal to) about 0.2 terahertz and below (including equal to) about 40 terahertz. The emission component 110 can emit the first frequency and the reception component 120 can collect the response 150 from this emission. After the emission component 110 emits the first frequency, the emission component 110 can emit the second frequency such that the first frequency and second frequency are emitted in series and therefore frequencies of the radiation set 130 do not interfere with one another.

The radiation set 130 can be a beam set upon an area of several integrated circuits 140 forming a system and the response 150 can be compared with responses of identical and fully functional integrated circuits (e.g., etalon responses). With this, an impinging radiation beam can be scanned over the area of the integrated circuits and multiple responses can be recorded as a function of scanning beam position with comparisons of the etalon responses (e.g., at the same scanning beam position). In one example, the radiation set 130 can be modulated as a function of time or frequency and the response 150 can be recorded as a function of frequency or modulation frequency. Further, a temperature of the integrated circuit 140 can be modulated as a function of time and the response 150 can be recorded as a function of temperature and/or the modulation frequency. In one example, the modulation frequency of radiation can be between 1 Hz and 1 THz while a modulation frequency of temperature can be between 1 Hz and 1 MHz. In one embodiment, the radiation set 130 is used to measure a low frequency noise spectral density (e.g., that is the response 150) and the comparison can be with an etalon noise spectral density, such as when the noise is measured in the bandwidth between 0.01 Hz and 10 MHz. The radiation set 130 can be a radiation pattern.

The response 150 of the integrated circuit 140 to the radiation set 130 can be a voltage. In one example, a transistor set of the integrated circuit 140 can be biased with a substrate of the integrated circuit 140. The radiation set 130 can cause the transistor set of the integrated circuit 140 to respond by producing voltage due to this biasing. The reception component 120 can be physically coupled to a pin set of the integrated circuit 140. By way of this physical coupling to the pin set, the reception component 120 can sense the voltage that is the response 150 to the radiation set 130.

In one embodiment, the emission of the radiation set 130 upon the integrated circuit 140 occurs wirelessly. In another embodiment, the emission component 110 can physically couple to the integrated circuit 140 and the emission component 110 can emit the radiation set 130 by way of a waveform generator. The integrated circuit 140 can comprise the transistor set, such as a transistor set of at least about 1000 transistors and therefore be considered a very large-scale integrated circuit. The integrated circuit 140 can be packaged or unpackaged, be under bias or unbiased, as well as being independent or installed in a system.

The emission component 110 and the reception component 120 can be considered a system to test the integrated circuit 140 under bias by measuring the response 150 to the radiation set 130. The radiation set 130 can be, for example, a radio frequency (about three gigahertz to about three-hundred gigahertz), a sub-terahertz frequency (over about three-hundred gigahertz to under about one terahertz), or terahertz frequency (above about one terahertz). The response 150 can be between pins of the integrated circuit 140 when the integrated circuit 140 is illuminated by the radiation set 130. The response 150 can be, for example, a function of frequency, radiation intensity, position of a scanning radiation beam on a surface of the integrated circuit 140, or a combination thereof.

In one example, the integrated circuit 140 can be silicon and under bias. The integrated circuit 140 can comprise a transistor set of field effect transistors. The response 150 of the integrated circuit 140 to the radiation set 130 can be by way of an excited decaying plasma wave. Example detection of the response 150 from the integrated circuit 140 can comprises gate leakage current measurement, parasitic resistance measurement, channel mobility measurement, channel saturation velocity measurement, channel transport measurement, threshold voltage measurement, or a combination thereof.

In one embodiment, the system 100 can function for period and/or constant monitoring of the integrated circuit 140. As part of this, the system 100 can comprise a component that transmits a visual and/or audio signal indicating a failure or potential failure of the integrated circuit 140. Additional fail safes can be implemented, such as shutting down an operation of a system that include the integrated circuit 140 when the failure is detected or switching to another system that is not indicated as having a failure on its integrated circuit 140.

In one example, before beginning operation, multiple integrated circuits 140 can be available. The emission component 110 and the reception component 120 can function upon the individual integrated circuits 140 (e.g., each integrated into identical systems). A best performing integrated circuit 140 (e.g., an integrated circuit 140 with fewest failures) can be chosen. In one example, the reception component 120 determines a placement of the individual integrated circuits 140 within a accuracy range (e.g., 1% to 100%), and chooses a highest placing integrated circuit for initial usage.

Figure 2:
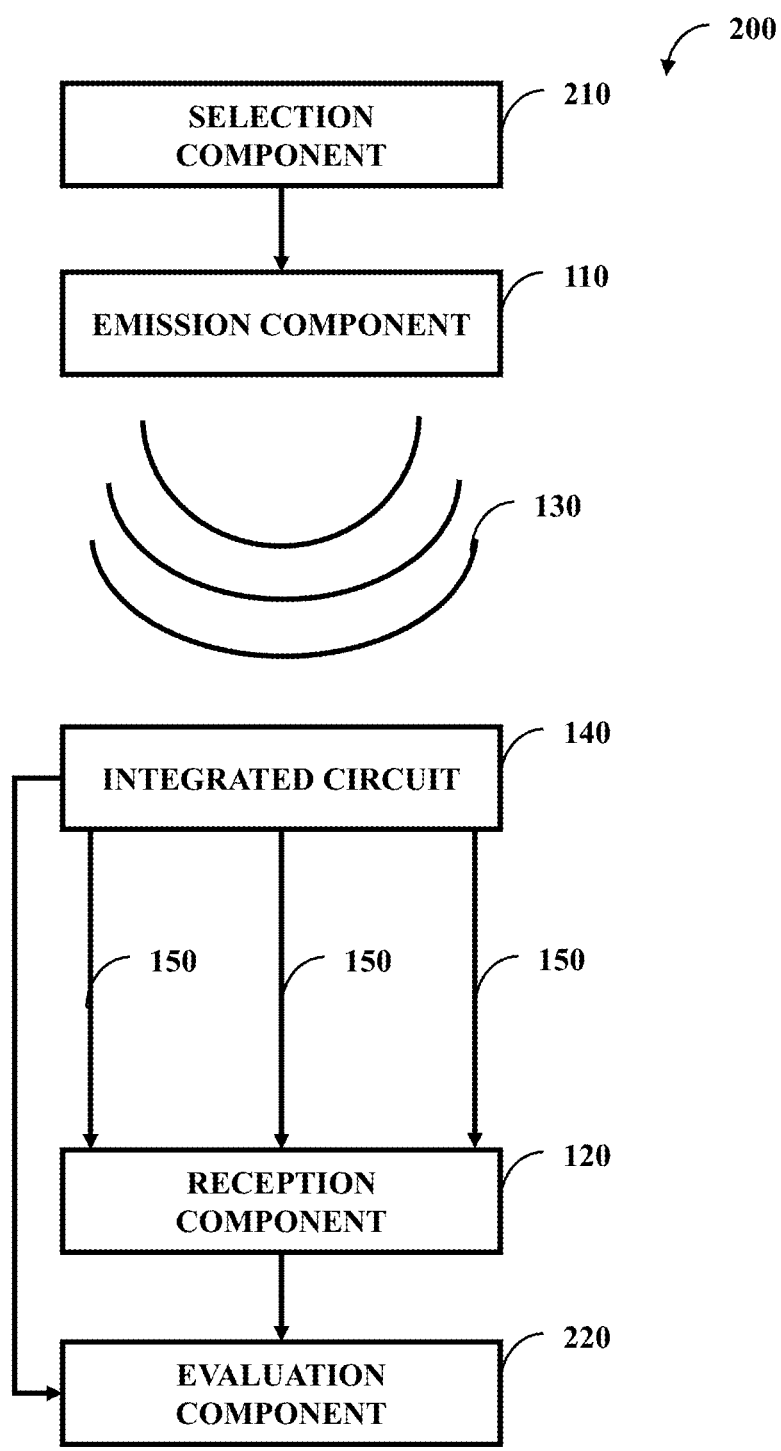
FIG. 2 illustrates one embodiment of an environment with a system comprising the emission component, the reception component, a selection component, and an evaluation component.

FIG. 2 illustrates one embodiment of an environment 200 with a system comprising the emission component 110, the reception component 120, a selection component 210, and an evaluation component 220. The selection component 210 can be configured to select a radiation value for the radiation set 130 from a set of possible radiation values. The evaluation component 220 can be configured to evaluate a feature set of the integrated circuit 140 to produce an evaluation result. The selection of the radiation value can be based, at least in part, on the evaluation result.

In one example, physical characteristics for the integrated circuit 140 can be inputted into a graphical user interface. These physical characteristics can be an example of the feature set. Based on these physical characteristics, the selection component 210 can select the radiation value. One type of integrated circuit can have little response to low frequencies, such as a frequency of about 0.2 terahertz, and therefore low frequencies can be skipped and testing can occur at a higher frequency. Conversely, the integrated circuit 140 can be highly delicate. Therefore, subjecting the integrated circuit 140 to high frequencies, such as a frequency of about 40 terahertz, can cause damage to the integrated circuit 140. Therefore, the selection component 210 can select a frequency that is not anticipated to cause damage (unless causing such damage is desired).

Figure 3:
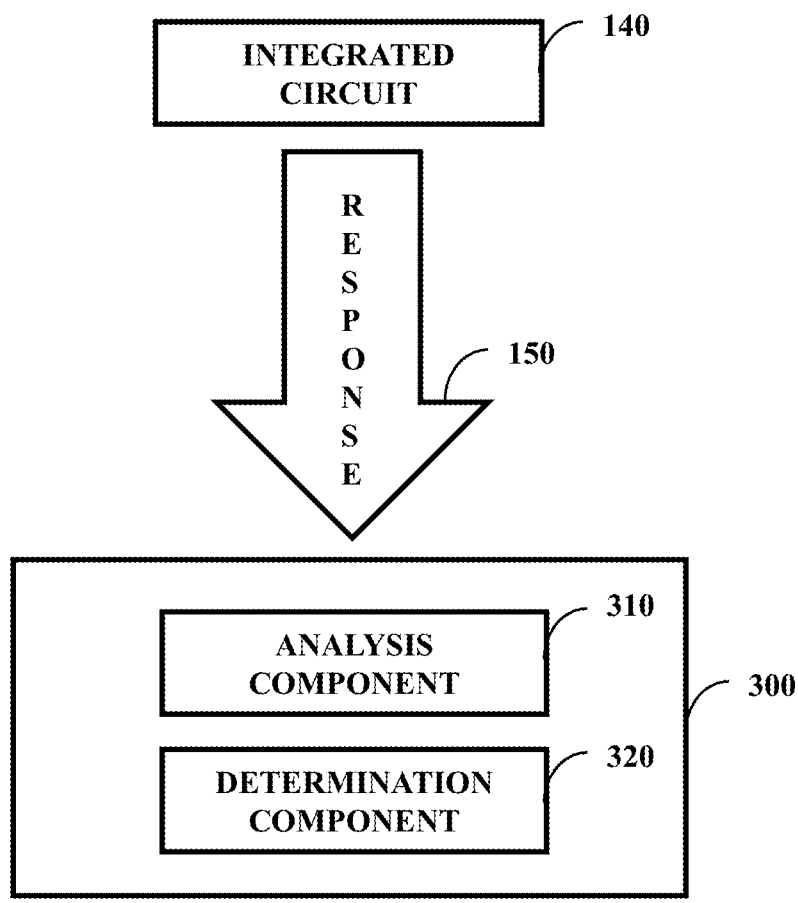
FIG. 3 illustrates one embodiment of a system comprising an analysis component and a determination component.

FIG. 3 illustrates one embodiment of a system 300 comprising an analysis component 310 and a determination component 320. The analysis component 310 can be configured to perform an analysis on the response 150, such as when the response 150 is produced by an emission of a radiation, which can be at least part of the radiation set 130 of FIG. 1, upon the integrated circuit 140. The determination component 320 can be configured to determine a health of the integrated circuit 140 based, at least in part, on a result of the analysis.

In one embodiment, the analysis can be voltage-based. The response 150 can be a voltage. The analysis can comprise comparing the voltage against a voltage standard (e.g., a voltage from an etalon circuit considered a fully operational circuit). With this, a radiation emitted upon the integrated circuit 140 can be known and therefore an expected response from the integrated circuit 140 can be known. The expected response can be particular to a specific radiation. This expected response can be the voltage standard. If the response does not match the expected response, such as match within a defined tolerance, then the determination can be that the integrated circuit 140 is failing and not healthy. Therefore, the determination component 320 can determine the health based, at least in part on if the comparison results such that the voltage meets the voltage standard. In this, the determination component 320 can establish from a difference that results from the comparison the present or absence of one or more failures of the integrated circuit and/or the nature of such failure(s).

This voltage-based analysis can function on a pin-by-pin level. In one example, the integrated circuit 140 can comprise thirty-two pins. The individual pins can have expected voltage responses of different values from one another. Thirty-one pins can have expected responses while one pin can have a voltage that does not meet the expected response. This can be considered as the integrated circuit 140 failing since one pin does not meet the expected response. However, a configuration can be used where one pin not meeting the expected response does not place the health of the integrated circuit 140 as failing.

As part of the voltage-based analysis, the determination component 320 can determine health based on power supplied. The radiation set 130 of FIG. 1 can be supplied at a certain power and based on this power a voltage can be expected as an expected response. The voltage can be compared against a power supplied, such as by an expected voltage based on the power supplied, to determine the health of the integrated circuit 140.

Figure 4:
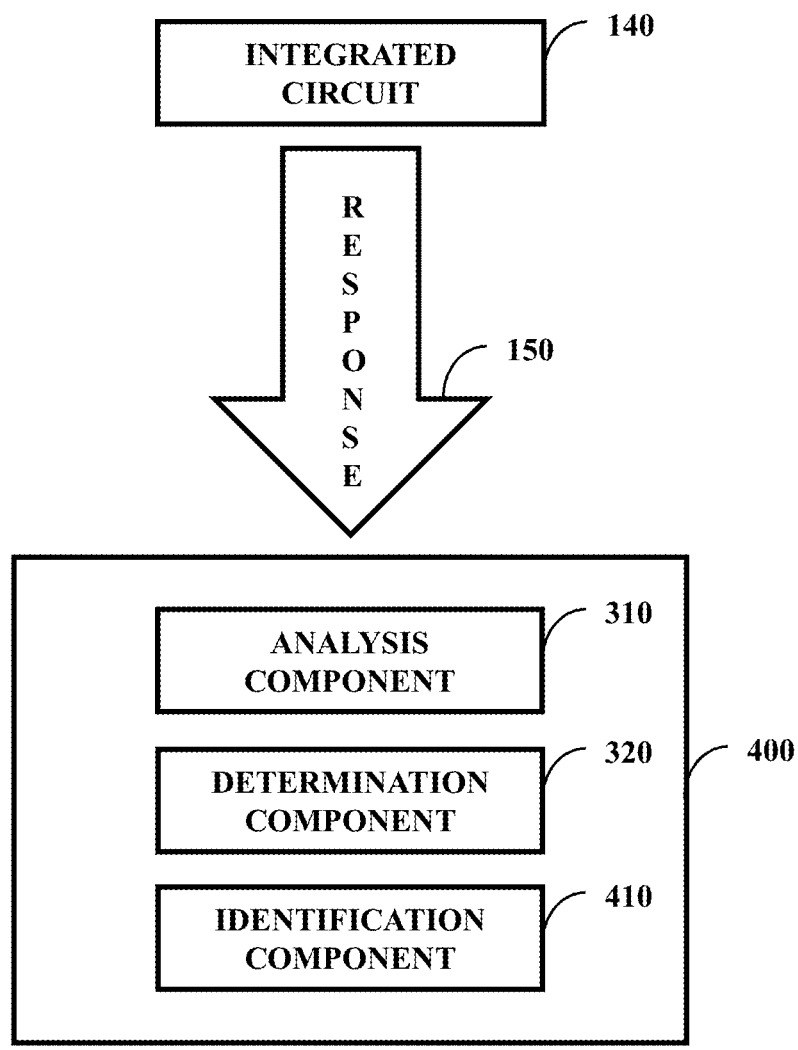
FIG. 4 illustrates one embodiment of a system comprising the analysis component, the determination component, and an identification component.

FIG. 4 illustrates one embodiment of a system 400 comprising the analysis component 310, the determination component 320, and an identification component 410. The identification component 410 can be configured to identify a failure in the integrated circuit 140 when the health of the circuit is determined to be failing. The failure can be identified, at least in part, by way of a comparison discussed in FIG. 3, such as based on a value of the voltage in comparison to an expected voltage.

Returning to the example above, the integrated circuit 140 can have thirty-two pins. Thirty-one of these pins can return an expected voltage while one pin can return with an unexpected voltage. While the determination component 320 can output a report of the failure, such as that the integrated circuit 140 fails or highlight the pin that fails, the identification component 410 can identify the failure itself.

In one example, a higher than expected voltage can indicate a first failure while a lower than expected voltage can indicate a second failure. The first failure can be a physical failure of one hardware portion of the integrated circuit 140 while the second failure can be a physical failure of another, different hardware portion. In one example, the integrated circuit 140 is a Monolithic Microwave Integrated Circuit.

Figure 5:
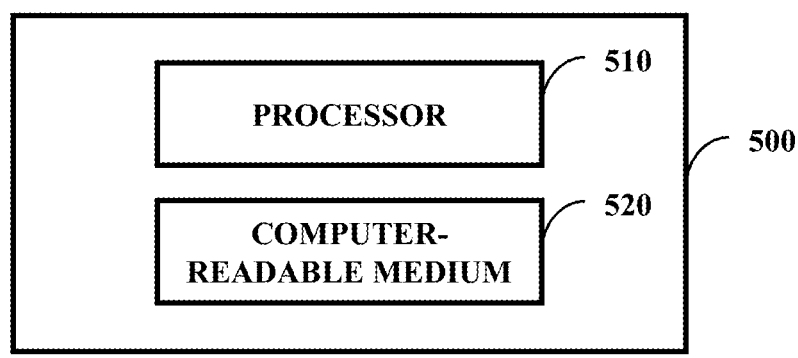
FIG. 5 illustrates one embodiment of a system comprising a processor and a computer-readable medium.

FIG. 5 illustrates one embodiment of a system 500 comprising a processor 510 (e.g., a general purpose processor or a processor specifically designed for performing a functionality disclosed herein) and a computer-readable medium 520 (e.g., non-transitory computer-readable medium). In one embodiment, the computer-readable medium 520 is communicatively coupled to the processor 510 and stores a command set executable by the processor 510 to facilitate operation of at least one component disclosed herein (e.g., the emission component 110 of FIG. 1). In one embodiment, at least one component disclosed herein (e.g., the analysis component 310 of FIG. 3) can be implemented, at least in part, by way of non-software, such as implemented as hardware by way of the system 500. In one embodiment, the system 500 functions as the data processing unit discussed in above regarding FIG. 1. In one embodiment, the computer-readable medium 520 is configured to store processor-executable instructions that when executed by the processor 510, cause the processor 510 to perform a method disclosed herein (e.g., the methods 600-900 addressed below).

Figure 6:
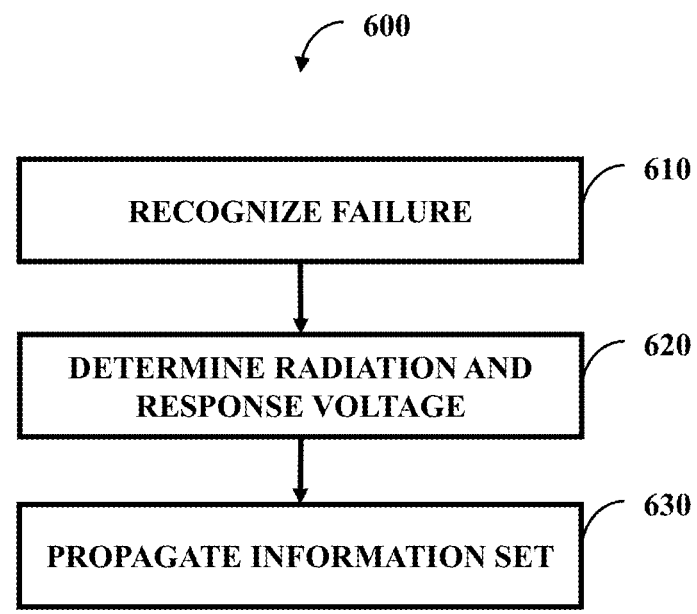
FIG. 6 illustrates one embodiment of a method comprising three actions.

FIG. 6 illustrates one embodiment of a method 600 comprising three actions 610-630. At 610, recognizing a failure of the integrated circuit 140 of FIG. 1 can occur. This recognition can include determining that the failure exists, such as a yes/no determination, as well as identifying the failure, such as an associated failing pin, portion, or hardware element (e.g., a specific transistor). This can be done by way of a failure test apparatus (e.g., the system 100 of FIG. 1), such as by receiving and processing a response from the failure test apparatus or being the failure test apparatus itself. At 620, determining a radiation frequency (e.g., of the radiation set 130 of FIG. 1) subjected upon the integrated circuit 140 of FIG. 1 can take place. Also at 620, determining a response voltage of the integrated circuit 140 of FIG. 1 that is in response to being subjected to the radiation frequency can take place. At 630, there can be propagating an information set onto a database, where the information set reflects the radiation, the response voltage, and the failure.

The database can be built or updated by way of this propagation. In one example, a customer can purchase a large number of integrated circuits—this purchase can include multiple orders at different times to different physical locations. As information is learned about the integrated circuits, this information can be aggregated into the database. Users at different physical locations can use the database to diagnose, and potentially correct, failures. Additionally, information in the database can be forwarded to an integrated circuit manufacturer so that their product can be improved and/or aspects disclosed herein can be used by the integrated circuit manufacturer for quality control purposes.

Figure 7:
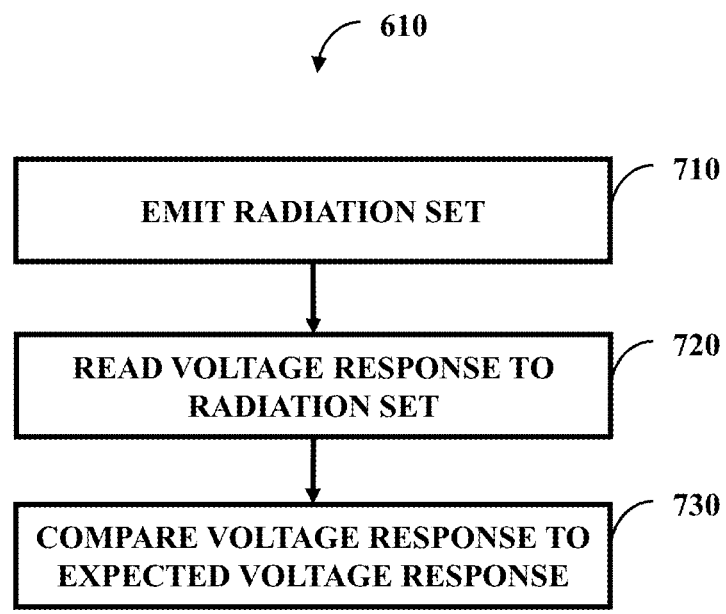
FIG. 7 illustrates one embodiment of the action illustrated as a method comprising three actions.

FIG. 7 illustrates one embodiment of the action 610 illustrated as a method comprising three actions 710-730. At 710, wirelessly emitting the radiation set 130 of FIG. 1 (e.g., one or more radio frequencies) upon the integrated circuit 140 of FIG. 1 can occur. At 720, reading a voltage response of the integrated circuit 140 of FIG. 1 to the radiation set 130 of FIG. 1 can take place. The reading of the voltage response can occur by way of a physical coupling with a pin set of the integrated circuit 140 of FIG. 1. At 730, there can be comparing an expected voltage response to the radiation set 130 of FIG. 1 against the voltage response to produce a comparison result. This comparison result can indicate the failure. In one example, the comparison can be subtracting the expected response from the voltage response and if the outcome of the subtraction is not zero, within a tolerance, then a failure is indicated.

Figure 8:
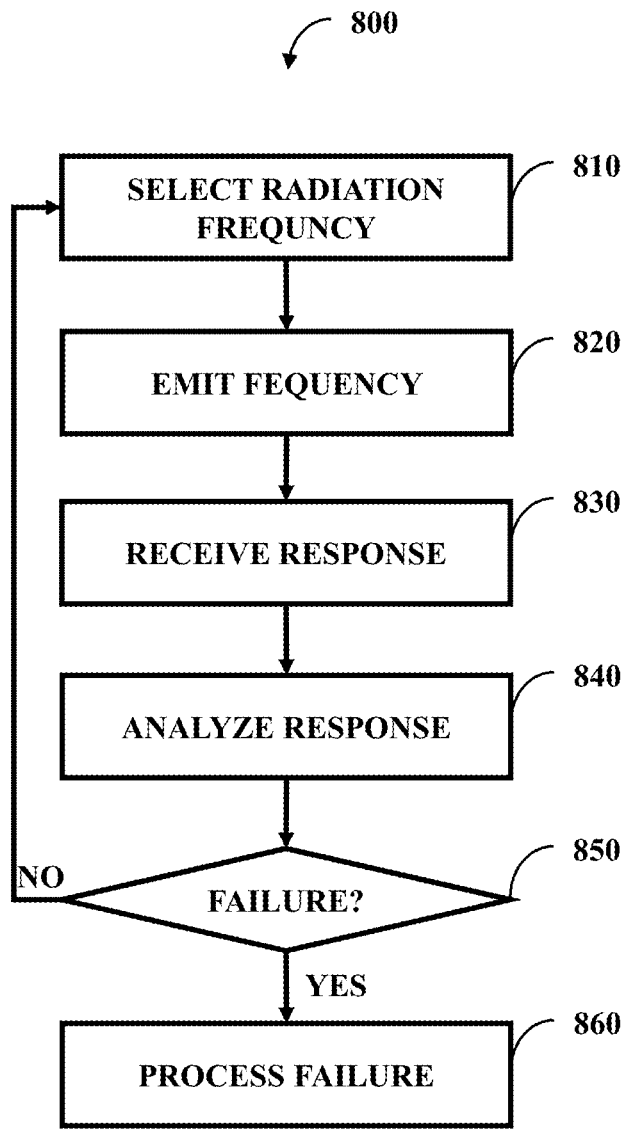
FIG. 8 illustrates one embodiment of a method comprising six actions.

FIG. 8 illustrates one embodiment of a method 800 comprising six actions 810-860. The method 800 can relate to a process of subjecting the integrated circuit 140 of FIG. 1 to multiple frequencies (e.g., multiple radio waves at different radio frequencies in series). At 810, a radiation can be selected, such as 2 terahertz and, at 820, the 2 terahertz radiation can be emitted. A response from the integrated circuit 140 of FIG. 1 to this radiation can be received at 830 and analyzed at 840. At 850, a check can occur to determine if the integrated circuit 140 of FIG. 1 fails. If the integrated circuit 140 of FIG. 1 does not fail, then the method 800 can return to action 810 and another radiation can be selected, such as 4 terahertz. Other embodiments can be practiced such as performing another check to determine if another radiation should be selected, generating and outputting a report that indicates the health of the integrated circuit 140 of FIG. 1 (e.g., lighting a pass or a fail indicator light), or making an entry into a database. If the check at 850 indicates a failure, then the method can continue to, at 860, process the failure. An example of processing the failure can include generating and outputting a report that indicates the failure.

The method 800 can end after processing the failure. In one example, a first radiation and a second radiation (e.g., the first being higher than the second) can be scheduled to be emitted. The first radiation can ultimately cause a determination that the integrated circuit 140 of FIG. 1 is failing. With this information, it can be unnecessary to subject the integrated circuit 140 of FIG. 1 to the second frequency if a failing end result is denoted by failure in light of a single radio frequency. With this, resources can be saved such that emission does not occur when failure is already identified.

Figure 9:
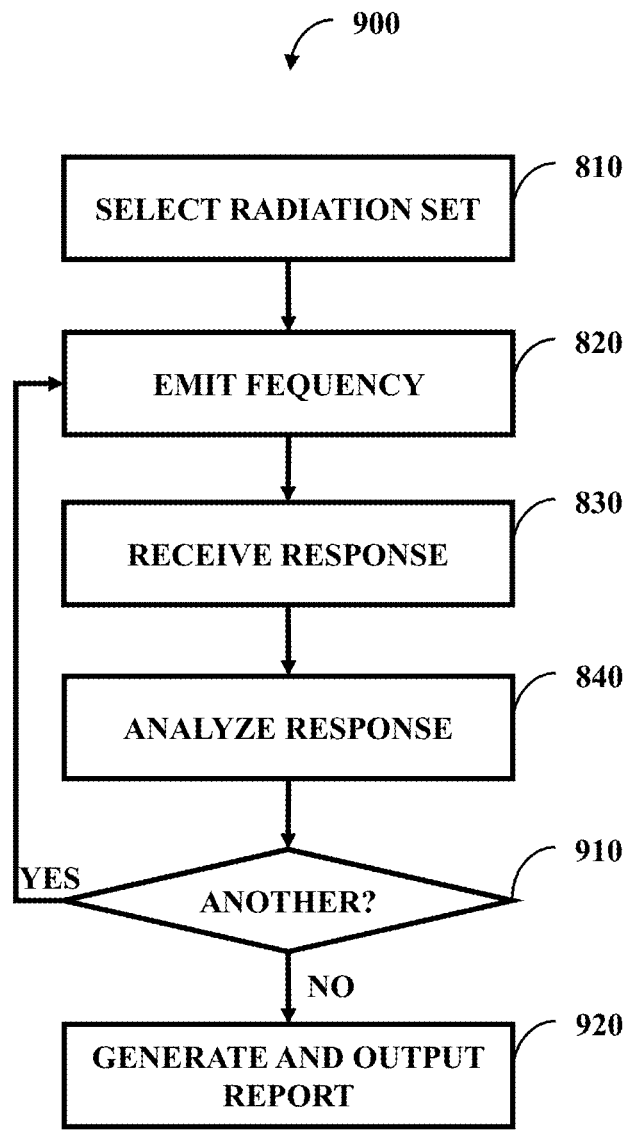
FIG. 9 illustrates one embodiment of a method comprising six actions.

FIG. 9 illustrates one embodiment of a method 900 comprising six actions 810-840 and 910-920. The method 900 can function similarly to the method 800 of FIG. 8 with actions 810-840 occurring, but here action 810 can be selecting the radiation set 130 of FIG. 1 (e.g., select the values of frequencies when more than one radiation frequency is selected). A check can be performed, at 910, on if another radiation should be emitted (or selected if the method 900 were to return to 810 instead of 820 as illustrated). If another frequency is to be emitted, then the method 900 can return to action 820. If another frequency is not to be emitted, then, at 920, a report can be generated and outputted that indicates a health of the integrated circuit 140 of FIG. 1.

While aspects disclosed herein relate to a clear pass/fail evaluation of the integrated circuit 140 of FIG. 1, other implementations can be practiced. In one example, the integrated circuit 140 of FIG. 1 can be exposed to first and second frequencies in accordance with the method 900. A near perfect match can be considered a pass, a close match (e.g., designated by a technician) can be a semi-pass, and a non-close and non-near perfect match can be a fail. One of the two frequencies resulting in a semi-pass and the other being a pass can be an overall pass. However, two frequencies resulting in a semi-pass can be considered a fail. With this, overall health is not determined until a battery is completed or until a failing threshold is met (e.g., one fail or two semi-passes).

While the methods disclosed herein are shown and described as a series of blocks, it is to be appreciated by one of ordinary skill in the art that the methods are not restricted by the order of the blocks, as some blocks can take place in different orders. Similarly, a block can operate concurrently with at least one other block.

Figure 10A:
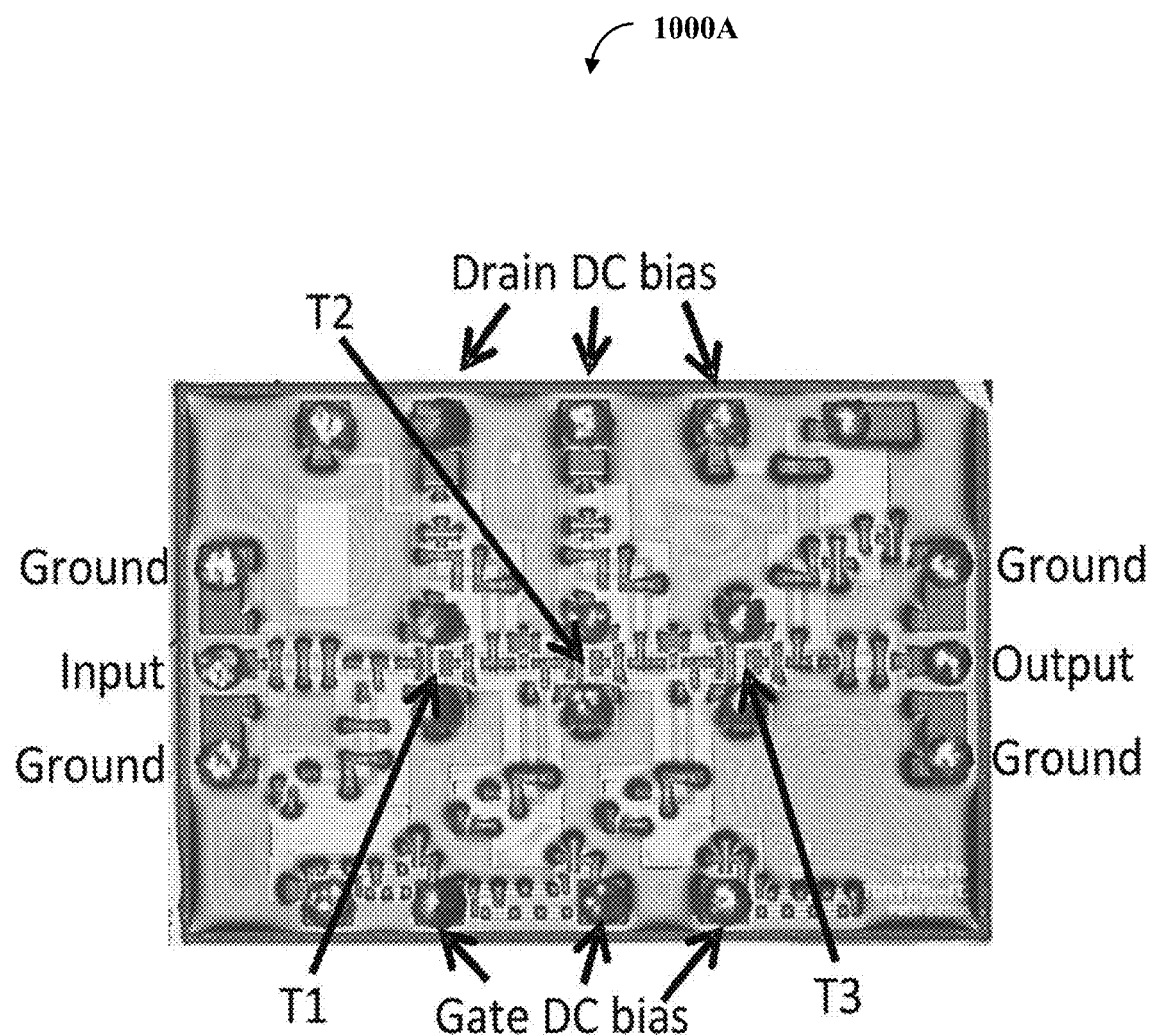
FIGS. 10A-10E illustrate one embodiment of a testing environment and four graphs.
Figure 10B:
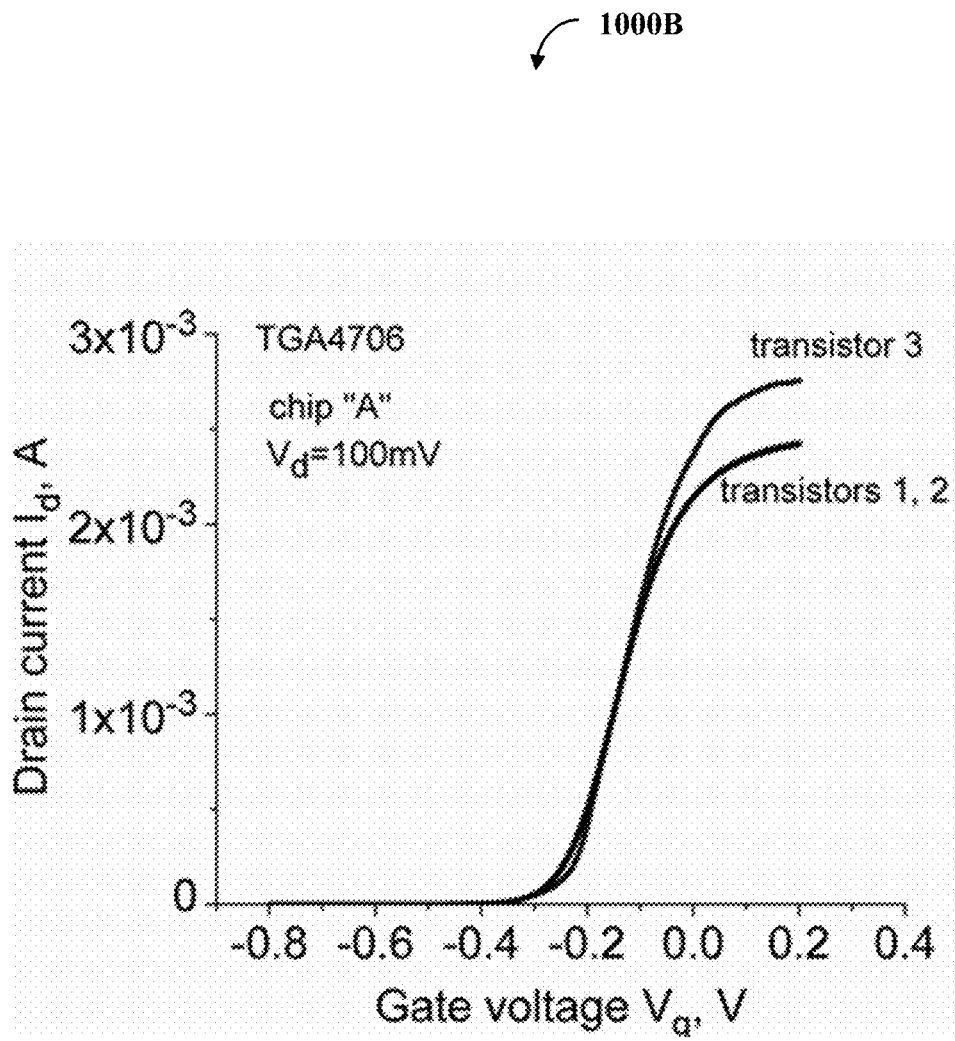
Figure 10C:
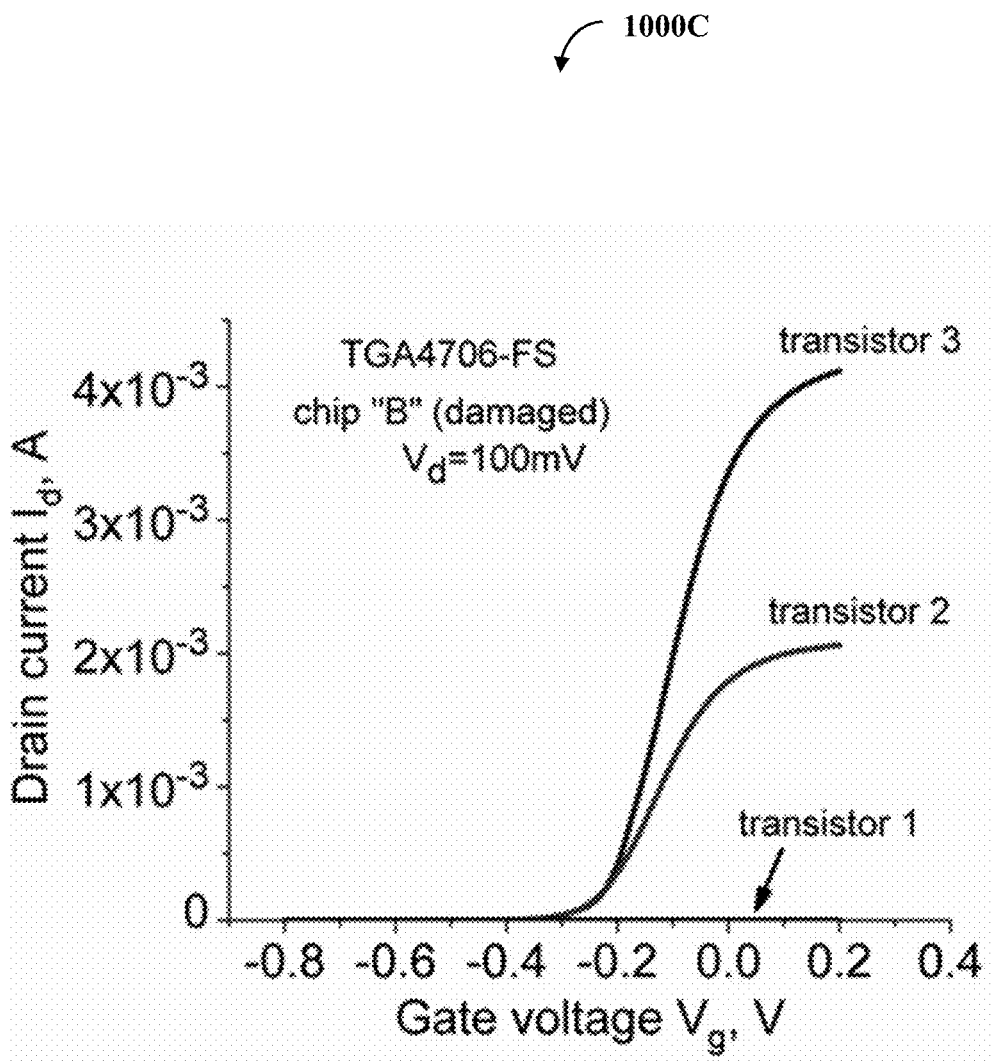

FIGS. 10A-10E illustrate one embodiment of a testing environment 1000A and four graphs 1000B-E. FIG. 10A illustrates an example semiconductor and with low noise amplifiers operating in the frequency Range: 76-83 GHz and 72-80 GHz, respectively. FIGS. 10B and 10C illustrate current voltage characteristics measured on the MMICs terminals which lead to gates and drains of separate transistors in the semiconductor. Biasing and matching passive elements are included between these output terminals and transistors. The graph 1000B shows the characteristics for the virgin circuit while the graph 1000C shows the characteristics for the circuit damaged by adding a drop of a conducting glue in the vicinity of the input transistor (Transistor 1 (T1)). The purpose of this conducting glue is to simulate an unintended short circuit, which, in practice, may result from a fault in the integrated-circuit fabrication process (for instance, during the metallization, sputtering, or annealing procedures).

Figure 10D:
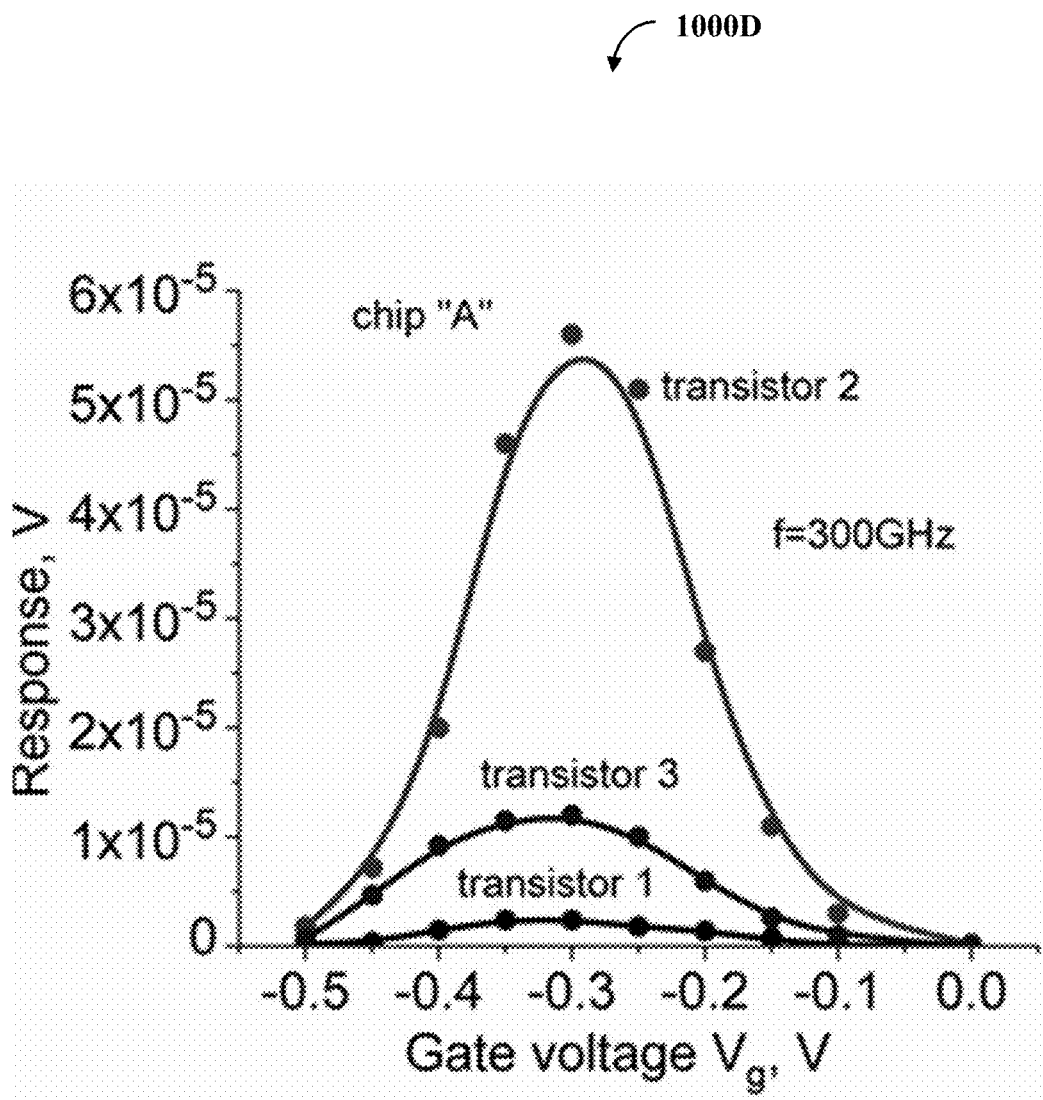
Figure 10E:
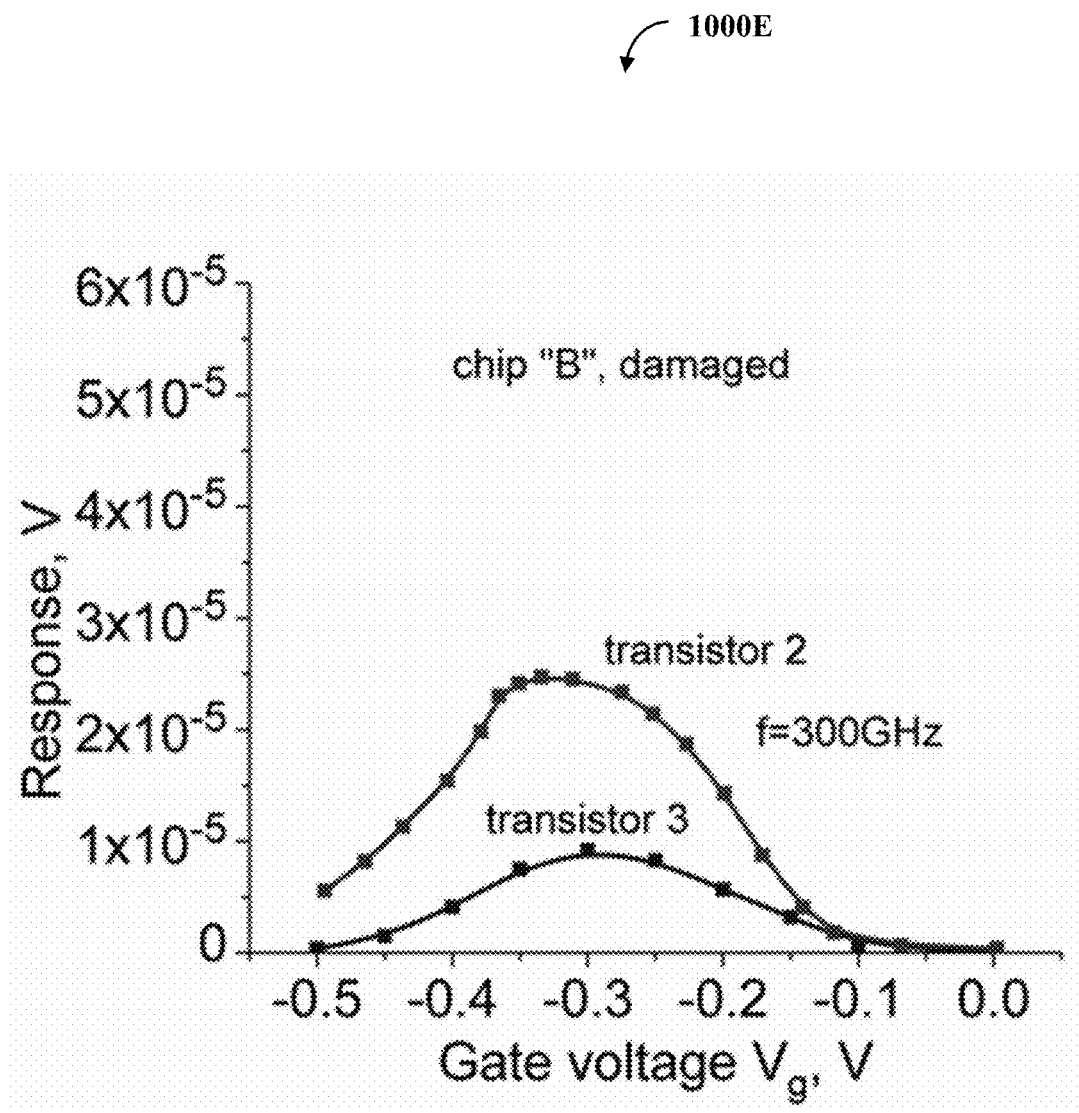

FIGS. 10D and 10E illustrate the DC response on the drain terminals of the virgin 1000D and damaged 1000E amplifiers as a function of the gate voltage under exposure to a low power 300 GHz radiation. These dependences have the similar shape as response from a single transistor. The response peaks at the transistor threshold voltage (as compared with graphs 1000B and 100C). This shows that the THz response could be used for the threshold voltage extraction.

As can be seen, the two circuits have different shapes and amplitudes of the response. The shape of the dependences is in qualitative agreement with the analytical theory of the overdamped plasmonic detection. As seen from FIG. 10D, the response to 300 GHz radiation for the transistors 1 and 2 is different, although their transfer current voltage characteristics are about identical. This is the effect of inductors and capacitors as well as resistors included in the circuit for the biasing and matching purposes.

In one embodiment, polarization dependences of the response compared with the cosine response can be as expected for a straight interconnect conductor. This shape of the polarization response is consistent with THz radiation coupling via bonding connections. The polarization response could be also used as a part of the test vector for identifying the circuit faults.

Aspects disclosed herein can be used for frequency dependence of the response as a part of the defect signature. The responsivity of FETs is a strong function of frequency and the device feature size. A crude estimate of the peak response frequency, fpeak, can be given by fpeak, ~α/L, where L is the gate length and α~15 THz/nm, α~130 THz/nm, and α~45 THz/nm for Si, InGaAs and GaN FETs, respectively. At lower frequencies, the response can drop approximately as $1/f^2$ and, at frequencies higher than the peak frequency it drops approximately as $1/f^{0.5}$. Hence, this technique could work in fairly broad frequency range.

Practicing aspects disclosed herein can be used in resolving a single transistor defect in an integrated circuit. The ultimate resolution can be even higher, since the transistor response strongly depends on the boundary conditions at the gate edges, on the leakage current, and on parasitic resistances. A response to the THz radiation measured between the pins or contact pads of an integrated circuit allows to establish and identify the integrated circuit faults using the response bias and polarization dependences. This allows for the ability to identify individual transistor defects.

What is claimed is:

1. A system, comprising:
an analysis component configured to perform a first analysis on a response produced by an emission of a radiation upon a first integrated circuit; and
a determination component configured to determine a health of the first integrated circuit based, at least in part, on a result of the analysis,
a selection component configured to make a selection between the first integrated circuit and a second integrated circuit,
where the analysis component is configured to perform a second analysis on a response produced by an emission of the radiation upon the second integrated circuit,
where the determination component is configured to determine a health of the second integrated circuit based, at least in part, on a result of the second analysis,
where the selection component makes the selection, at least in part, through comparison of the health of the first integrated circuit against the health of the second integrated circuit,
where a report is outputted that indicates the health,
where the report indicates the health, at least in part, by way of indicating the healthier integrated circuit between the first integrated circuit and the second integrated circuit, and
where the analysis component, the determination component, the selection component, or a combination thereof is implemented, at least in part, by way of hardware.

2. The system of claim 1, comprising:
an identification component configured to identify a failure in the integrated circuit when the health of the circuit is determined to be failing.

3. The system of claim 1,
where the response is a voltage,
where the analysis comprises a comparison of the voltage against a voltage standard, and
where the health is determined based on if the comparison results such that the voltage meets the voltage standard.

4. The system of claim 3, comprising:
an identification component configured to identify a failure in the integrated circuit when the health of the circuit is determined to be failing,
where the failure is identified, at least in part, by way of a value of the voltage.

5. The system of claim 4, comprising:
a recordation component configured to create a record in a database that reflects technical detail of the radiation, the voltage, and the failure.

6. The system of claim 1,
where the response is a voltage,
where the emission is made with a power supplied,
where the analysis comprises a comparison of the voltage against the power supplied, and
where the health is determined based on if the comparison results as expected.

7. The system of claim 1,
where the response produced by emission of the radiation upon the integrated circuit is a response by a transistor set of the integrated circuit due to a bias of the transistor set.

8. The system of claim 1,
where the response is a noise spectral density.

9. The system of claim 1,
where the radiation is modulated as a function of time.

10. The system of claim 1,
where the response is a response by a transistor set of the integrated circuit due to a bias of the transistor set.

11. The system of claim 1,
where the emission of the radiation upon the integrated circuit occurs wirelessly.

12. The system of claim 1,
where the integrated circuit selected by the selection component is incorporated into an apparatus when the integrated circuit produces the response.

13. A system, comprising:
an analysis component configured to perform an analysis on a response produced by an emission of a radiation upon an integrated circuit; and
a determination component configured to determine a health of the integrated circuit based, at least in part, on a result of the analysis,
where a report is outputted that indicates the health and
where the analysis component, the determination component, or a combination thereof is implemented, at least in part, by way of hardware,
where analysis comprises a comparison of the voltage against the voltage standard at a pin-by-pin level,
where an individual pin of the integrated circuit has a voltage response,
where the voltage response of the individual pin is compared against a voltage standard of the individual pin to produce a comparison result,
where the analysis component is configured to compare the comparison result against an expected result,
where if the comparison result does not match the expected result, the determination component is configured to determine the health of the integrated circuit to be not healthy independent of a comparison of a comparison result of any other pin of the integrated circuit.

14. The system of claim 13, comprising:
an identification component configured to identify the individual pin that causes the determination component to be configured to determine the health of the integrated circuit to be not healthy; and
an output component configured to cause the report to be output,
where the report indicates the individual pin that is identified.

15. A system, comprising:
an analysis component configured to perform an analysis on a response produced by an emission of a radiation upon an integrated circuit; and
a determination component configured to determine a health of the integrated circuit based, at least in part, on a result of the analysis,
where a report is outputted that indicates the health,
where the analysis component, the determination component, or a combination thereof is implemented, at least in part, by way of hardware,
where analysis comprises a comparison of the voltage against the voltage standard at a pin-by-pin level,
where the radiation is a first radiation at a first frequency value,
where the emission of the first radiation is supplied by a source,
where the first response is a first voltage response of the integrated circuit to the first radiation,
where the analysis component is configured to compare the first voltage response against a first voltage standard,
where the integrated circuit is subjected to an emission of a second radiation at a second frequency value from the source when the comparison indicates the health is not failing, and
where the integrated circuit is not subjected to an emission of a second radiation at a second frequency value from the source when the comparison indicates the health is failing.

16. A system, comprising:
an analysis component configured to perform an analysis on a response produced by an emission of a radiation upon an integrated circuit; and
a determination component configured to determine a health of the integrated circuit based, at least in part, on a result of the analysis,
where a report is outputted that indicates the health,
where the analysis component, the determination component, or a combination thereof is implemented, at least in part, by way of hardware,
where analysis comprises a comparison of the voltage against the voltage standard at a pin-by-pin level,
where the radiation comprises a first radiation and a second radiation,
where the response comprises a first response and a second response,
where the first radiation and the second radiation are at different frequency values,
where the first response is a first voltage response of the integrated circuit to the first radiation,
where the second response is a second voltage response of the integrated circuit to the second radiation,
where the analysis component is configured to compare the first voltage response against a first voltage standard,
where the analysis component is configured to compare the second voltage response against a second voltage standard,
where the first voltage response not matching the first voltage standard within a first tolerance results in the health being failing regardless if the second voltage response matches the second voltage within a second tolerance, and
where the second voltage response not matching the second voltage standard within a second tolerance results in the health being failing regardless if the first voltage response matches the first voltage within the first tolerance.

17. A system, comprising:
an analysis component configured to perform an analysis on a response produced by an emission of a radiation upon an integrated circuit; and
a determination component configured to determine a health of the integrated circuit based, at least in part, on a result of the analysis,
where a report is outputted that indicates the health,
where the analysis component, the determination component, or a combination thereof is implemented, at least in part, by way of hardware,
where analysis comprises a comparison of the voltage against the voltage standard at a pin-by-pin level,
where the analysis component is configured to compare a result of the comparison against an expected result, and
where if the comparison result does not match the expected result, the determination component is configured to determine the health of the integrated circuit to be not healthy.

18. A system, comprising:
an analysis component configured to perform an analysis on a response produced by an emission of a radiation upon an integrated circuit;
a determination component configured to determine a health of the integrated circuit based, at least in part, on a result of the analysis; and
an identification component configured to identify a failure in the integrated circuit when the health of the circuit is determined to be failing,
where a report is outputted that indicates the health,
where the analysis component, the determination component, or a combination thereof is implemented, at least in part, by way of hardware,
where analysis comprises a comparison of the voltage against the voltage standard at a pin-by-pin level,
where the failure is identified, at least in part, by way of a value of the voltage,
where when the voltage exceeds the voltage standard, the identification component identifies the failure as a first failure,
where when the voltage falls below the voltage standard, the identification component identifies the failure as a second failure, and
where the first failure and the second failure are different failures.

* * * * *